(12) United States Patent
Hart

(10) Patent No.: US 8,410,605 B2
(45) Date of Patent: Apr. 2, 2013

(54) EXTENDED UNDER-BUMP METAL LAYER FOR BLOCKING ALPHA PARTICLES IN A SEMICONDUCTOR DEVICE

(75) Inventor: Michael J. Hart, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/451,226

(22) Filed: Apr. 19, 2012

(65) Prior Publication Data

US 2012/0199959 A1    Aug. 9, 2012

Related U.S. Application Data

(62) Division of application No. 12/624,294, filed on Nov. 23, 2009, now abandoned.

(51) Int. Cl.
*H01L 23/48* (2006.01)
*H01L 23/52* (2006.01)
*H01L 29/40* (2006.01)

(52) U.S. Cl. ......... 257/738; 257/737; 257/739; 257/780

(58) Field of Classification Search ............... 257/736, 257/778–781, 733
See application file for complete search history.

(56) References Cited

U.S. PATENT DOCUMENTS

| | | | |
|---|---|---|---|
| 5,220,199 A | 6/1993 | Owada et al. | |
| 5,767,546 A | 6/1998 | Williams et al. | |
| 6,043,429 A | 3/2000 | Blish, II et al. | |
| 6,287,893 B1 | 9/2001 | Elenius et al. | |
| 6,521,996 B1 | 2/2003 | Seshan | |
| 6,531,759 B2 | 3/2003 | Wachnik et al. | |
| 6,894,390 B2 | 5/2005 | Schammler et al. | |
| 6,960,829 B2 | 11/2005 | Hogerl | |
| 7,230,338 B2 | 6/2007 | Yuzawa et al. | |
| 7,325,716 B2 | 2/2008 | Debelius et al. | |
| 7,470,985 B2 | 12/2008 | Farooq et al. | |
| 7,701,056 B2 | 4/2010 | Su | |
| 8,293,634 B2 | 10/2012 | Anderson et al. | |
| 2003/0119300 A1 | 6/2003 | Chiu et al. | |
| 2004/0094837 A1 | 5/2004 | Greer | |
| 2004/0164409 A1 | 8/2004 | Schammler et al. | |
| 2007/0001317 A1 | 1/2007 | Matsuoka et al. | |
| 2010/0140760 A1 | 6/2010 | Tam et al. | |
| 2011/0115073 A1 | 5/2011 | Chen | |
| 2011/0121438 A1 | 5/2011 | Hart | |
| 2011/0175220 A1 | 7/2011 | Kuo et al. | |
| 2011/0210443 A1 | 9/2011 | Hart et al. | |

FOREIGN PATENT DOCUMENTS

| | | |
|---|---|---|
| JP | 01286448 A | 11/1989 |
| JP | 11111885 A | 4/1999 |
| JP | 2006294761 A | 10/2006 |

OTHER PUBLICATIONS

U.S. Appl. No. 12/624,294, filed Nov. 23, 2009, Hart.
U.S. Appl. No. 13/343,227, filed Jan. 4, 2012, Yip et al.

*Primary Examiner* — Telly Green
(74) *Attorney, Agent, or Firm* — LeRoy D. Maunu; Lois D. Cartier

(57) ABSTRACT

An integrated circuit (IC) has an under-bump metal (UBM) pad disposed between a solder bump and a semiconductor portion of the IC. A UBM layer is disposed between the solder bump and the semiconductor portion and includes the UBM pad and a UBM field. The UBM pad has a contact perimeter formed with the solder bump. The UBM pad extends beyond the contact perimeter a sufficient distance to block alpha particles emitted from the surface of the solder bump from causing an upset event in the semiconductor portion. The UBM field is separated from each UBM pad by a gap extending from the UBM pad to the UBM field so as to electrically isolate the UBM field from the UBM pad.

12 Claims, 6 Drawing Sheets

EXTENDED UNDER-BUMP METAL LAYER FOR BLOCKING ALPHA PARTICLES IN A SEMICONDUCTOR DEVICE

CROSS-REFERENCE TO RELATED APPLICATION

This application is a divisional of pending U.S. patent application Ser. No. 12/624,294, filed Nov. 23, 2009, entitled "Extended Under-Bump Metal Layer for Blocking Alpha Particles in a Semiconductor Device" by Michael J. Hart, which is hereby incorporated herein by reference.

FIELD OF THE INVENTION

This invention relates generally to techniques for fabricating integrated circuits, and more particularly to techniques for reducing single-event upset errors from solder bumps or balls.

BACKGROUND

Integrated circuits (ICs) using CMOS techniques are susceptible to single-event upsets due to alpha particles. An alpha particle can cause ionizing radiation when it passes through a semiconductor device. The resulting charge generated by an alpha particle can accumulate at a device node and change the state of the node, typically by shorting a transistor source-drain and hence disturbing the logic state of that transistor. For example, if a node in a memory cell stores a zero data value, charge accumulation at the node can flip the data value to a one. Such data state changes are commonly called "single-event upsets" (SEUs).

A common source of alpha particles is the material used in fabricating ball grid arrays (BGAs) or bump arrays on integrated circuits. Bump arrays and BGAs are often used to provide electrical and mechanical connections between an IC chip and a printed wiring board or package carrier. The material used to form the balls or bumps often contains lead, which can be a source of alpha particles.

Various techniques have been developed to avoid alpha particles emitted by lead in solder bumps from creating SEUs in the associated IC. One approach is to coat the solder bumps with a layer of alpha particle absorbing material. Another approach incorporates a high-density layer of alpha particle absorbing metal deposited on selected areas of the IC. Both of these approaches introduce additional process steps into the IC manufacturing sequence and hence add additional undesired cost.

Techniques that reduce SEUs due to alpha particles from balls or bumps on ICs that avoid the disadvantages of the prior art are desirable.

SUMMARY

An IC has a solder bump on an under-bump metal (UBM) pad disposed between the solder bump and a semiconductor portion of the IC. The UBM pad has contact perimeter formed with the solder bump, and extends extending beyond the contact perimeter a sufficient distance to block alpha particles emitted from the surface of the solder bump from causing an upset event in the semiconductor portion. In a further embodiment, underfill material surrounds solder bump. In a particular embodiment, the UBM pad extends at least ten microns from the contact perimeter. In an alternative embodiment, the UBM pad is polygonal, and has a corner distal from the contact perimeter that is at least ten microns from the surface of the solder bump.

In a particular embodiment, the UBM pad is fabricated from a UBM layer comprising copper at least nine microns thick. In a further embodiment, a UBM field is fabricated from the UBM layer. The UBM field is separated from the UBM pad by a gap extending from the UBM pad to the UBM field so as to electrically isolate the UBM field from the UBM pad. The UBM field may be left floating, or alternatively be connected to a voltage reference, such as ground or Vdd. In a particular embodiment, the IC has a die surface area and a plurality of UBM pads. The combined area of the plurality of UBM pads and the UBM field underlie at least 99.9% of the die surface area between a solder bump array and the silicon portion of the IC.

In a particular embodiment, the UBM pad extends over a passivation layer and a protective layer of the IC. A solder mask layer on the UBM pad defines a contact aperture having the contact perimeter. Alternatively, the UBM pad extends over a passivation layer and beneath a protective layer, which has been patterned to define a contact aperture having the contact perimeter. The protective layer is, for example, a polyimide layer. UBM pads are circular or polygonal, and may be of mixed shape or size on an IC.

In an embodiment, an IC is fabricated by establishing a contact diameter of a solder bump for the IC. The IC has a BEOL stack, for which the BEOL alpha particle stoppage probability is calculated or otherwise determined. An underfill thickness having an underfill alpha particle stoppage probability is calculated so that the sum of the BEOL alpha particle stoppage probability and the underfill alpha particle stoppage probability provides a greater than 99% probability that an alpha particle not greater than 5 MeV will be stopped by underfill and the BEOL stack. A UBM pad dimension is calculated to provide a UBM pad that extends sufficiently beyond the solder bump contact diameter so that an alpha particle emitted by the solder bump formed on a solder bump contact will travel through underfill from any point on the surface of the solder bump by at least the selected underfill thickness before reaching the outer edge of the UBM pad when the IC is incorporated into an assembly with underfill. The UBM pad is fabricated on the IC from a UBM layer to have the calculated UBM pad dimension and a solder bump is formed on the UBM pad. In a further embodiment, the IC is attached to a carrier (e.g., a package substrate or printed wiring board), and underfill is applied between the IC and the carrier.

In a further embodiment, the UBM pad is separated from a field of UBM layer material by a gap. In a particular embodiment, a plurality of UBM pads and the field is formed from the UBM layer. Each of the plurality of UBM pads is isolated from the field by a corresponding plurality of gaps. The plurality of UBM pads in combination with the field provide a remaining UBM layer area at least 99% of the IC die area. In a particular embodiment, the UBM layer comprises a layer of copper or copper alloy. In a more particular embodiment, the UBM layer is at least 9 microns thick.

DETAILED DESCRIPTION

Figure 1:
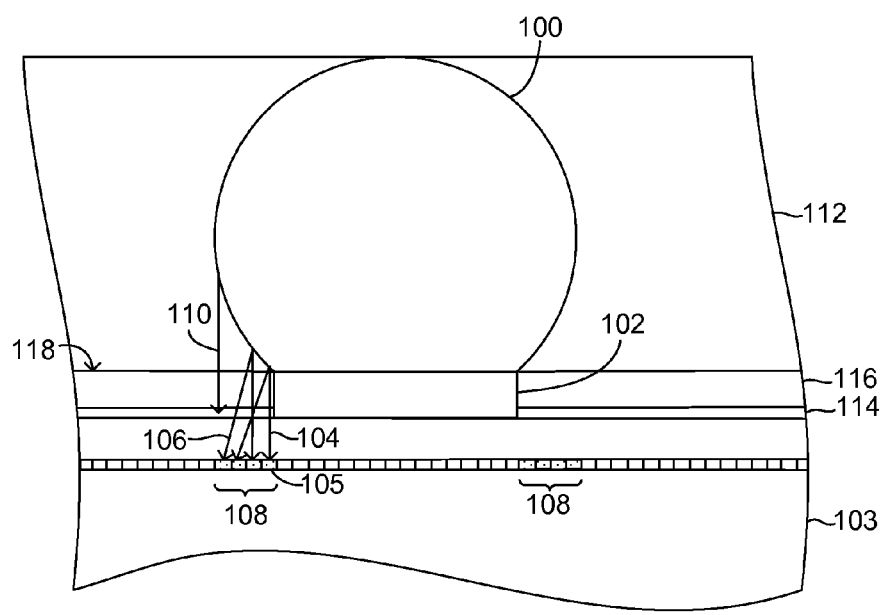
FIG. 1 is a side view of a solder bump and associated pattern of SEUs associated with a conventional under-bump metal pad of an IC.

FIG. 1 is a side view of a solder bump 100 and associated pattern of SEUs associated with a conventional under-bump metal (UBM) pad 102 of an IC. A conventional UBM pad is basically a flat layer of metal, such as a copper-based alloy or copper-nickel, that the bump material (typically a lead or lead-tin alloy, commonly referred to as solder) adheres to. The UBM pad is typically self-aligned to the bump edge. For example, bump material deposited on the IC wafer is heated to melt the bump material, which wets the UBM pad and forms a self-aligning ball or bump on top of the pad. For convenience of discussion, the term "bump" will be used to denote what are commonly called solder balls or solder bumps.

Alpha particles 104, 106 emitted from the lead in the bump 100 near the edges of the bump can reach the underlying transistors 105, such as storage transistors in memory (e.g., SRAM) cells formed over silicon 103, and cause an alpha-upset event (e.g., corrupt the SRAM cell state). Since this type of data upset is caused by a single event (i.e., a single alpha particle), these events are called SEUs. An annulus (donut ring) of SEUs 108 may be observed around solder bumps on an IC, particularly where SRAM cells underlie the solder bump. The region of SEUs 108 is typically about ten microns to about twenty microns from the inner diameter of the annulus to the outer diameter.

In particular ICs, alpha particles emitted from the periphery of the solder bump (peripheral alphas) only cause SEUs in an annulus around the UBM pad 102. Underfill 112 adjoining the bump 100 is added after the IC is attached to the printed wiring board or carrier (not shown). Underfill processes are commonly known in the art of IC assembly, and epoxy or epoxy composites are common underfill materials. The underfill 112, in combination with the IC passivation layer 114 and masking or protective layer 116, which in a particular IC is a layer of polyimide material about seven microns thick, block alpha particles 110 originating more than about ten microns from the surface 118 of the IC die.

The angle of incidence is measured from the normal direction to the major surface of the IC die. In other words, an alpha particle hitting the surface perpendicularly has an angle of incidence of zero degrees, while an alpha particle at thirty degrees from normal (i.e., sixty degrees from the planar surface) has an angle of incidence of thirty degrees. As the angle of incidence increases, the distance that the alpha particles traverse through the underfill 112, protective layer 116, and passivation layer 114 increases. For example, at an angle of incidence of forty-five degrees, the distance traversed by an alpha particle originating at the periphery of the solder bump increases by a factor of 1.41 times. Extending the UBM pad beyond the perimeter of the solder bump can block peripheral alphas from reaching the underlying transistors and memory cells, and reduce SEUs.

Figure 2:
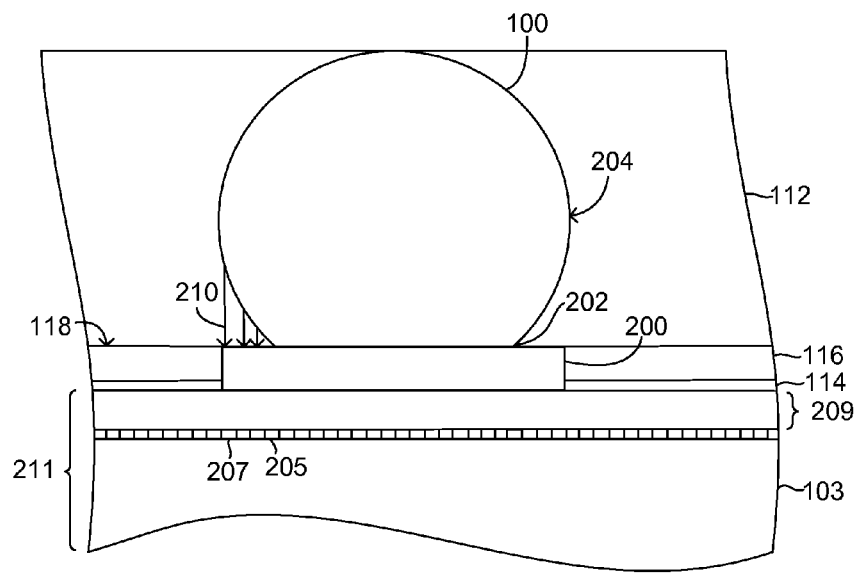
FIG. 2 is a side view of a solder bump and under-bump metal pad according to an embodiment.

FIG. 2 is a side view of a solder bump 100 and UBM pad 200 according to an embodiment. The UBM pad 200 extends a selected distance beyond the contact perimeter 202 of the solder bump 100 with the UBM pad 200 and is surrounded by underfill 112. In a particular embodiment, the UBM pad 200 is fabricated from a copper-nickel layer at least about nine microns thick, which is sufficiently thick to block alpha particles having an energy of 5 MeV or less. Such alpha particles are similarly blocked if they that have travelled through at least ten microns of epoxy underfill and BEOL stack. The BEOL stack is the layers of patterned metal and intervening dielectric material of an IC. A complex IC, such as a field-programmable gate array (FPGA), may have ten or more patterned metal layers separated by inter-metal dielectric layers in a BEOL stack. The BEOL stack in combination with the passivation and polyimide layers will be referred to as the top stack of the IC for purposes of discussion.

In a particular embodiment, the UBM pad 200 extends at least about ten microns beyond the perimeter 202 of the solder bump 100, which is about 110 microns at the widest point 204 (essentially a sphere with a diameter of 110 microns that is truncated on the bottom, where it is bonded to the pad). Alternative extended distances are used with other sized solder bumps and balls, as the overhang of the solder bump from the contact area of the pad changes with bump diameter. In another embodiment, the UBM pad 200 is extended about twenty microns to about thirty microns beyond the perimeter of the solder bump 100. While alpha particles 210 have a distribution of energies, extended UBM pads according to embodiments essentially block alpha particles emitted from solder bumps from upsetting underlying memory cells or transistors 205, 207. A passivation layer 114 (e.g., a silicon nitride layer about 0.5 microns thick) and a protective layer 116 (e.g., a polyimide layer about seven microns thick) overlie the semiconductor portion 211 formed by silicon 103 and patterned metal layers alternating with dielectric layers 209, which provide electrical interconnections in the IC.

Figure 3:
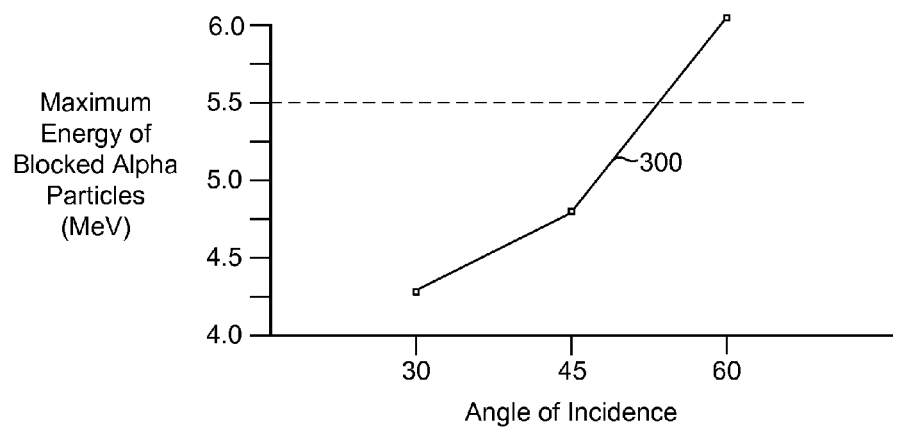
FIG. 3 is a plot of the energy blocked by passivation and polyimide layers on an IC versus angle of incidence of alpha particles from a solder bump.

FIG. 3 is a plot 300 of the energy blocked by passivation and polyimide layers on an IC in combination with the BEOL stack (see, FIG. 1, ref. nums. 114, 116) versus angle of incidence of alpha particles from a solder bump for an exemplary FPGA. The natural decay chain for Pb can create alpha particles up to about 6.5 MeV, but the vast majority of alpha particles being emitted from a solder bump have an energy less than about 5 MeV. Alpha particles having energy of about 5 MeV or less hitting the top stack at an angle of forty-five degrees or more are blocked by the top stack layers. UBM pads that extend sufficiently to block peripheral alpha particles with an angle of incidence less than forty-five degrees, in cooperation with the top stack layers, block essentially all of the peripheral alpha particles.

Figure 4:
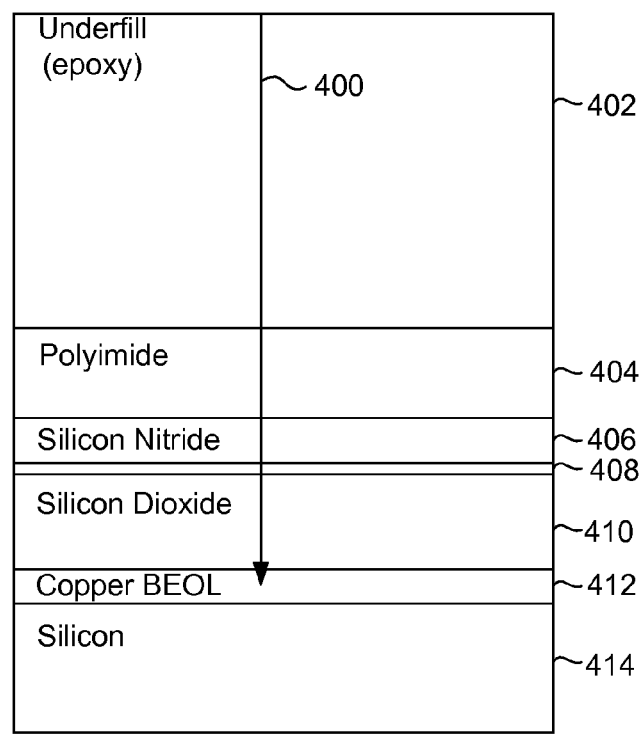
FIG. 4 is a side view representation of the penetration of 5 MeV alpha particles in a top stack of an IC according to an embodiment.

FIG. 4 is a side view representation of the penetration of 5 MeV alpha particles 400 in a top stack of an IC according to an embodiment. The penetration of the alpha particles was modeled using techniques according to those developed by J. F. Ziegler for determining the stopping and range of ions in matter (SRIM techniques). The representation is for an alpha particle at an angle of incidence of zero degrees, which is normal to the BEOL stack layers of an IC. Before reaching an underlying silicon device, an alpha particle passing through about ten microns of epoxy 402, about seven microns of polyimide 404, about 0.5 microns of a silicon nitride 406, about 1.4 microns of aluminum (e.g., upper layer wiring) 408, about 2.7 microns of silicon dioxide 410, and about one micron of copper 412 would be stopped before reaching the underlying silicon. Material stopping powers vary with elemental composition, and copper has much higher stopping power than polyimide or silicon dioxide per unit thickness.

The thicknesses of silicon dioxide and copper represent the cumulative thicknesses of these materials in a typical BEOL stack of patterned metal layers separated by inter-metal dielectric (IMD) layers. Each patterned metal layer has an associated density (i.e., the portion of the total area that is metalized), which in a typical metal layer is about 50% to about 60%. The probability that an alpha particle would hit a copper trace in a particular metal layer corresponds to the metal layer density. The thickness of copper in FIG. 4 basically accounts for the layer densities of the multiple metal layers (e.g., a ten metal layer stack), and represents a cumulative probability that an alpha particle would encounter multiple copper traces in multiple metal layers, but not necessarily a copper trace in each metal layer. An alpha particle having an energy of 5 MeV would have a very high probability of being stopped by the combination of the epoxy, polyimide, and BEOL stack, and would not reach the underlying silicon 414.

Prior ICs were often built with larger dimensions (commonly referred to as node geometry). ICs built on larger node geometries generally have thicker layers, wider traces, and so forth. In large geometry ICs having many patterned metal layers in the BEOL stack, the cumulative thickness of the metal traces combined with the probability that an alpha particle would hit multiple, relatively thick, copper traces as it travelled through the BEOL stack prevented many alpha particles from reaching the underlying silicon. SEUs arising from solder bump alpha emissions were relatively low in large geometry devices. As dimensions have been reduced, the thicknesses of the layers (and hence the thickness of the copper traces in the patterned metal layers of the BEOL stack) has also become reduced. The effect of having thinner copper traces in the patterned metal layers is that more alpha particles were able to reach the underlying silicon, producing the ring of SEUs discussed in reference to FIG. 1. Thus, embodiments of the invention are particularly desirable in ICs fabricated on a node geometry of 90 nm or less, and more particularly desirable in ICs fabricated on a node geometry of 40 nm.

Figure 5:
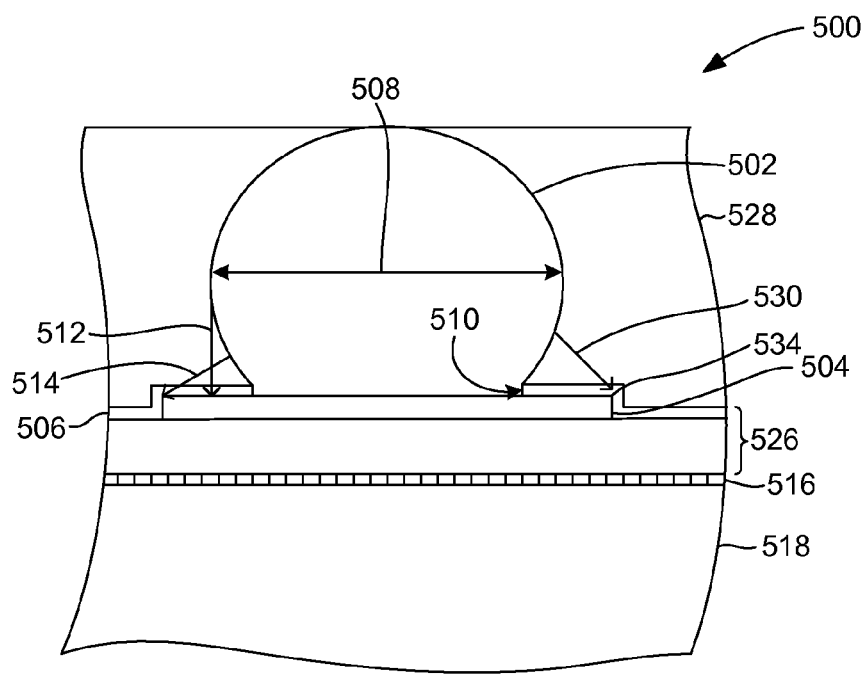
FIG. 5 is a cross section of a solder bump on a UBM pad of an IC according to an embodiment.

FIG. 5 is a cross section of a solder bump 502 on a UBM pad 504 of an IC 500 according to an embodiment. The solder bump 502 is formed on a UBM pad 504 that is masked with a layer of masking material 506 such as silicon dioxide, silicon nitride, polyimide or other suitable masking material. Contact apertures are defined in the masking material, and the solder bumps are formed in a self-aligned fashion over the contact apertures to bond with the underlying UBM pad 504. The solder bump has a diameter 508 of about 110 microns; however, this dimension is merely exemplary and for purposes of illustration.

The UBM pad 504 is a copper-nickel alloy or other suitable metal for forming solder bumps on, and in a particular embodiment is about nine microns thick. The UBM pad 504 extends at least about ten microns from the perimeter 510 of the contact aperture. The extended UBM pad 504 blocks alpha particles 512, 514 emitted from the periphery of the solder bump 502 from upsetting underlying transistors or memory cells 516 in the silicon 518 below the solder bump 502. An alpha particle originating more than ten microns above the BEOL stack 526 is blocked by the epoxy underfill 528 and the top stack 526. Similarly, an alpha particle 530 originating at an angle of incidence sufficient to clear the corner 534 of the UBM pad 504 is blocked by the underfill 528 and top stack 526. Thus, extending the UBM pad 504 beyond the contact aperture according to embodiments blocks alpha particles emitted from the periphery of the solder bump 502 from reaching the underlying transistors and SRAM cells, reducing SEUs. The IC is attached to a carrier (not shown), such as a package substrate or printed wiring board. After attaching the IC (e.g., through a solder re-flow process), underfill 528 is applied, as is known in the art of circuit assembly using BGA techniques.

Figure 6:
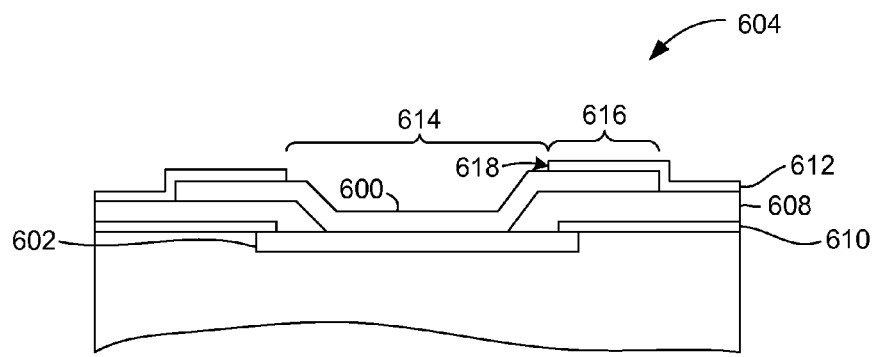
FIG. 6 is a cross section of a UBM pad according to an embodiment.

FIG. 6 is a cross section of an UBM pad 600 according to an embodiment. A solder bump (not shown) provides electrical contact to a conductive trace (wire) 602 of an IC 604. The conductive trace 602 is defined in a top metal layer, for example, and is an aluminum trace in a particular embodiment. A UBM pad 600, which is defined from a UBM layer of copper, copper-nickel, or other metal about 9 microns thick, is defined over the conductive trace 602, which it makes electrical contact to, and over a protective layer 608, which in a particular embodiment is a layer of polyimide about 7 microns thick. A passivation layer 610, which in a particular embodiment is a layer of silicon nitride about 0.5 microns thick, underlies the protective layer 608. A bump masking layer 612 defines a bump aperture 614 of the UBM pad 600. The UBM pad 600 extends a selected distance 616 beyond the perimeter edge 618 of the bump aperture 614 to block peripheral alpha particles emitted by the solder bump (not shown), which typically forms an approximate truncated sphere on the exposed portion (i.e., within the aperture) of the UBM pad 600. In a particular embodiment, the UBM pad 600 extends at least about ten microns beyond the perimeter edge 618 of the bump aperture.

Figure 7:
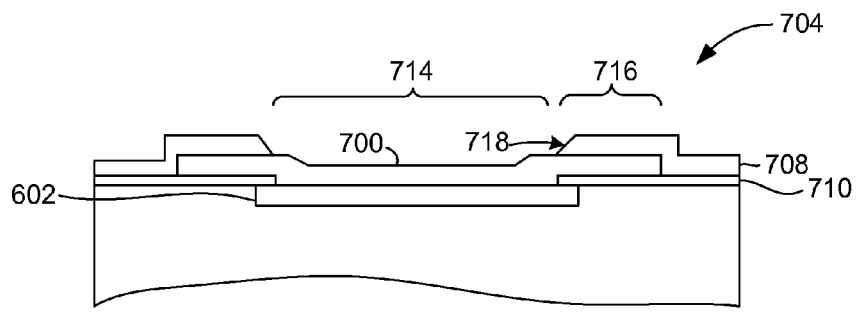
FIG. 7 is a cross section of a UBM pad according to an alternative embodiment.

FIG. 7 is a plan view of an under-bump metal pad 700 according to an alternative embodiment. A solder bump (not shown) provides electrical contact to a conductive trace (wire) 602 of an IC 704. The conductive trace 602 is defined in a top metal layer, for example, and is an aluminum trace in a particular embodiment. The UBM pad 700 is defined from a UBM layer of copper, copper-nickel, or other metal about 9 microns thick, is defined over the conductive trace 602, which it makes electrical contact to, and over a passivation layer 710, which in a particular embodiment is a layer of silicon nitride about 0.5 microns thick. Instead of using a separate solder mask layer (compare FIG. 6, ref. num. 612), a polyimide layer 708, which in a particular embodiment is about 7 microns thick, is patterned to form an aperture 714. The UBM pad 700 extends a selected distance 716 beyond the perimeter edge 718 of the bump aperture 714 to block peripheral alpha particles emitted by the solder bump (not shown), which typically forms an approximate truncated sphere on the exposed portion (i.e., within the aperture) of the UBM pad 700. In a particular embodiment, the UBM pad 700 extends at least about ten microns beyond the perimeter edge 718 of the bump aperture.

Figure 8:
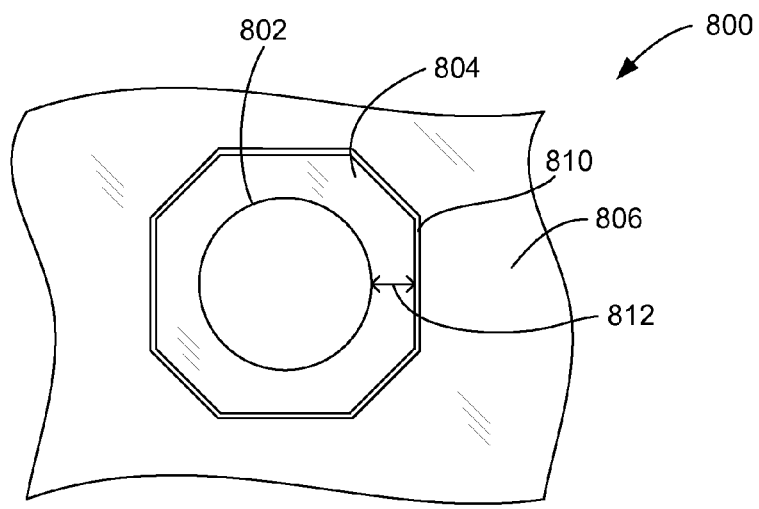
FIG. 8 is a plan view of a UBM layout according to an embodiment.

FIG. 8 is a plan view of a UBM layout according to an embodiment. UBM pads can be circular or polygonal, and solder bump contact apertures can be circular or polygonal. The UBM layer has a UBM pad 804 separated from the field of the UBM layer 806 by a gap 810 that provides electrical isolation between the field 806 and the pad 804. A solder bump 802 is greater in diameter than a contact aperture (not shown, see, e.g., FIG. 6, ref. num. 614, FIG. 7, ref. num. 714). For embodiments utilizing a polygonal UBM pad, it is desirable that the edge of the UBM pad 804 extend beyond the widest point of the solder bump 802 a selected distance 812 sufficient to block peripheral alpha particles from the solder bump 802 from causing an SEU in the underlying semiconductor device.

The UBM field 806 blocks alpha particles originating from underfill materials (not shown) or elsewhere. The gaps 810 are a minor portion of the area of the UBM layer, and in a particular embodiment constitute less than 0.1% of the die area (i.e., the plurality of UBM pads and the UBM field underlies at least 99.9% of the die surface area). Combined with lower count for underfill, such as ultra-low-alpha (ULA) underfill, which is specified to have less than 0.002 counts per hour/cm$^2$, SEUs arising from solder bump and underfill can be reduced to less than $1/1000^{th}$ from IC assemblies using conventional UBM layouts. In a particular embodiment, the gaps are approximately one micron between the UBM pads and the UBM field. Embodiments in accordance with FIG. 8 are particularly desirable in ICs fabricated on small node geometries (e.g., less than about 90 nm node geometry), or ICs having a relatively low number of metal layers in the BEOL stack, or ICs having low density metal layers in the BEOL stack, as such conditions diminish the alpha particle blocking effectiveness of the BEOL field.

Figure 9:
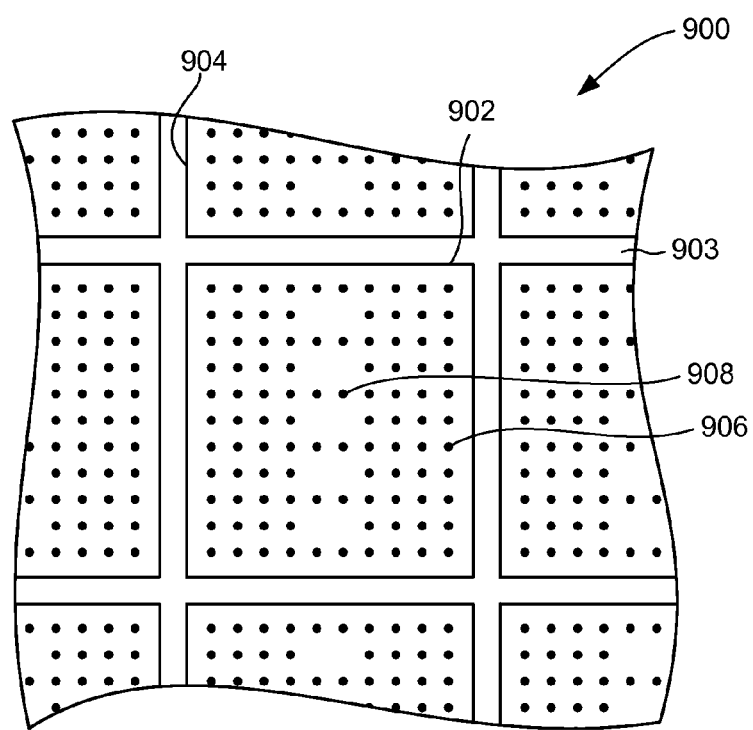
FIG. 9 is a plan view of a portion of an IC wafer having an FPGA with a bump array and under-bump metal layer according to an embodiment.

FIG. 9 is a plan view of a portion of an IC wafer 900 having an FPGA 902 with a bump array and under-bump metal layer according to an embodiment. The FPGA 902 is separated from other FPGAs on the IC wafer (e.g., FPGA 904) by alleys 903. ICs 902, 904 will be singulated from the IC wafer 900 for use in applications. An IC chip with a bump array is typically flip-chip bonded to a printed wiring board or package substrate. Underfill (not shown in this view) is typically applied between the IC chip and the wiring board or package substrate.

Solder bumps 906, 908 are formed on UBM pads (not shown in this view) that extend beyond the contact aperture of the solder bumps 906, 908 to block peripheral alpha particles emitted by the solder bumps 906, 908. In a further embodiment, a UBM field (see, e.g., FIG. 8, ref. num. 806) underlies most of the area of the IC 902 and blocks alpha particles from other sources. The UBM field is separated from the UBM pads by gaps (see, e.g., FIG. 8, ref. num 810), which electrically isolate the UBM pads from the UBM field. The UBM layer remaining after the IC is fabricated (i.e., the UBM pads and field combined) is at least 99% of IC die area, thus shielding at least 99% of the IC from alpha particles having energy less than the energy required to penetrate the UBM layer.

Figure 10:
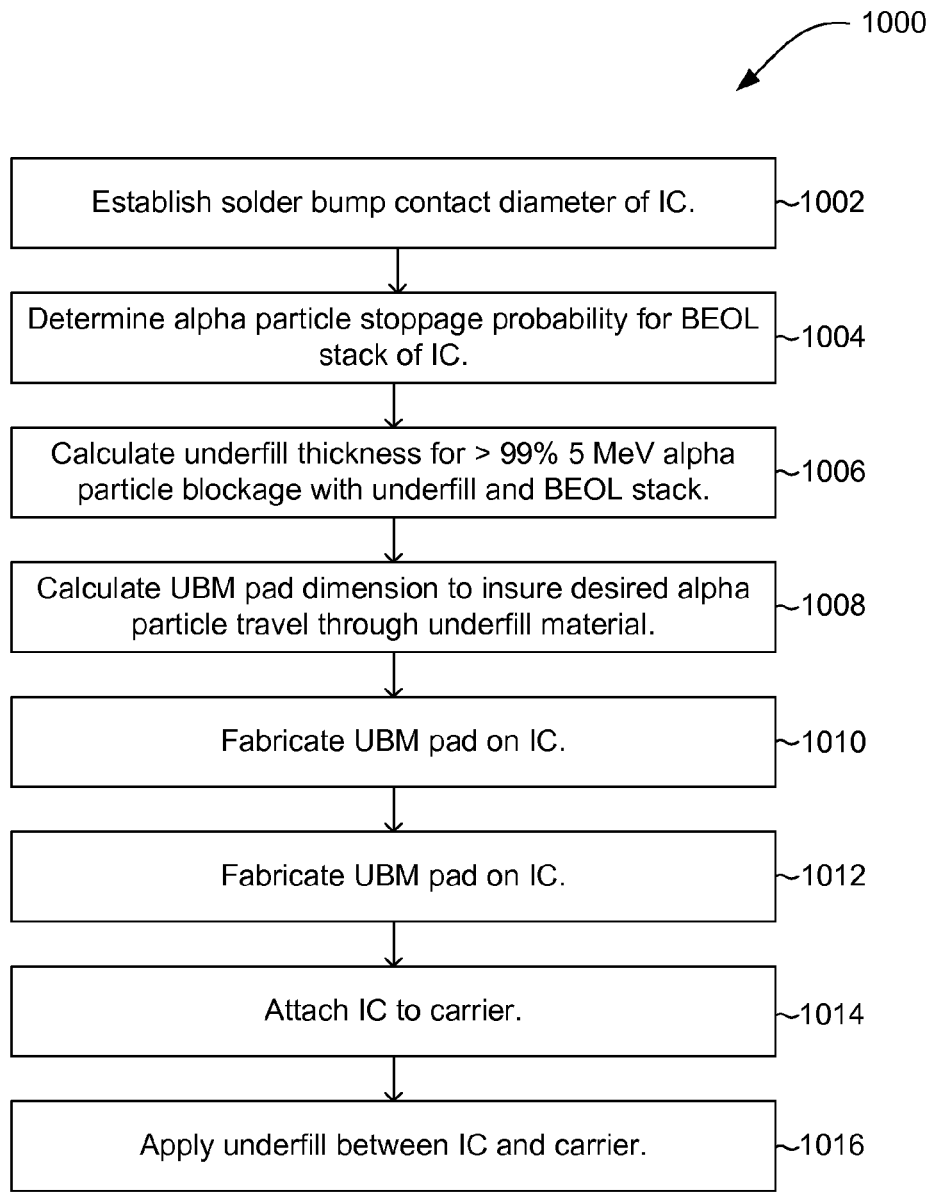
FIG. 10 is a flow chart of a method of fabricating an IC according to an embodiment.

FIG. 10 is a flow chart of a method of fabricating an integrated circuit 1000 according to an embodiment. A solder bump contact diameter is established (e.g., specified) for an IC having a BEOL stack (step 1002). A BEOL alpha particle stoppage probability is determined for the BEOL stack (step 1004) (see, e.g., FIG. 4 and associated Written Description). An underfill thickness having an underfill alpha particle stoppage probability is calculated so that the sum of the BEOL alpha particle stoppage probability and the underfill alpha particle stoppage probability provides a greater than 99% probability that an alpha particle not greater than 5 MeV will be stopped by the underfill and BEOL stack (step 1006). A UBM pad dimension is calculated sufficient to extend the UBM pad beyond the solder bump contact diameter so that an alpha particle emitted by a solder bump formed on the solder bump contact will travel through underfill by at least the selected underfill thickness before reaching the outer diameter of the UBM pad from any point on the surface of the solder bump when the IC is attached to (step 1008). The UBM pad is fabricated on the IC from a UBM layer to have the calculated UBM pad dimension (step 1010). A solder bump is formed on the UBM pad contacting the UBM pad at a contact diameter (step 1012). In a further embodiment, the IC is attached to a carrier (e.g., a package substrate or printed wiring board) (step 1014), and underfill is applied between the IC and the carrier (step 1016).

In a particular embodiment, the UBM layer is a layer of copper or copper alloy. In a more particular embodiment, the UBM layer is about 9 microns thick.

In a further embodiment, before fabricating the UBM pad, a gap is defined in the UBM layer between the UBM pad and a field of the UBM layer. In a particular embodiment, the field and pads of the UBM layer are designed to cover over 99% of the IC, which blocks alpha particles arising from the underfill material or other sources, and blocks most of the alpha particles emitted from the solder bump in assemblies incorporating small node geometry ICs that do not use underfill, and hence would not achieve the alpha particle blocking contribution of the underfill of step 1006, above.

While the present invention has been described in connection with specific embodiments, variations of these embodiments will be obvious to those of ordinary skill in the art. For example, an IC with a UBM layer field may be used without underfill, or alternative BEOL stacks may be incorporated in the IC. Therefore, the spirit and scope of the appended claims should not be limited to the foregoing description.

What is claimed is:

1. An integrated circuit (IC), comprising:
   a plurality of solder bumps, each solder bump having a surface;
   a semiconductor portion;
   a UBM layer disposed between the solder bumps and the semiconductor portion and including a plurality of under-bump metal (UBM) pads and a UBM field;
   wherein each UBM pad is disposed between a respective one of the solder bumps and the semiconductor portion, and the UBM pad has a contact perimeter formed with the respective solder bump,
   wherein each UBM pad extends over a passivation layer, over a protective layer, and beyond the contact perimeter a sufficient distance to block alpha particles emitted from the surface of the solder bump from causing an upset event in the semiconductor portion; and
   wherein the UBM field is separated from each UBM pad by a gap extending from the UBM pad to the UBM field so as to electrically isolate the UBM field from the UBM pad; and
   a solder mask layer on each UBM pad that defines a contact aperture having the contact perimeter.

2. The IC of claim 1, further comprising:
   underfill material disposed around each solder bump.

3. The IC of claim 2, wherein each UBM pad extends at least ten microns from the contact perimeter.

4. The IC of claim 2, wherein each UBM pad has a corner distal from the contact perimeter, the corner being at least ten microns from the surface of the solder bump.

5. The IC of claim 1, wherein the UBM layer comprises copper, and the UBM layer is at least nine microns thick.

6. The IC of claim 5, wherein:
   the IC has a die surface area; and
   the plurality of UBM pads and the UBM field underlie at least 99.9% of the die surface area.

7. The IC of claim 6, wherein each UBM pad is polygonal.

8. The IC of claim 6, wherein each UBM pad extends at least ten microns from the contact perimeter.

9. The IC of claim 6, wherein each UBM pad has a corner distal from the contact perimeter, the corner being at least ten microns from the surface of the solder bump.

10. The IC of claim 1, wherein the protective layer is a polyimide layer.

11. The IC of claim 1, wherein each UBM pad is circular.

12. The IC of claim 1, wherein each UBM pad is polygonal.

* * * * *